(12) United States Patent
Nagai

(10) Patent No.: US 7,186,488 B2
(45) Date of Patent: Mar. 6, 2007

(54) SEMICONDUCTOR DEVICE MANUFACTURING METHOD AND SEMICONDUCTOR DEVICE MANUFACTURING SYSTEM

(75) Inventor: Kouichi Nagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/070,097

(22) Filed: Mar. 3, 2005

(65) Prior Publication Data

US 2005/0196706 A1 Sep. 8, 2005

(51) Int. Cl.
*G03F 9/00* (2006.01)
*G03C 5/00* (2006.01)

(52) U.S. Cl. ............... 430/30; 430/312; 430/313; 430/316; 716/2

(58) Field of Classification Search ............ 430/30, 430/312, 313, 316; 716/2
See application file for complete search history.

(56) References Cited

U.S. PATENT DOCUMENTS 6,599,670 B2  7/2003  Ikuno et al.

6,756,168 B2 *  6/2004  Yu et al. ............... 430/30

FOREIGN PATENT DOCUMENTS

| JP | 5-47893     | 2/1993  |
|----|-------------|---------|
| JP | 11-186132   | 7/1999  |
| JP | 2000-49068  | 2/2000  |
| JP | 2000-235945 | 8/2000  |
| JP | 2000-277423 | 10/2000 |
| JP | 2001-144004 | 5/2001  |
| JP | 2001-338865 | 12/2001 |

* cited by examiner

*Primary Examiner*—Christopher G. Young
(74) *Attorney, Agent, or Firm*—Westerman, Hattori, Daniels & Adrian, LLP.

(57) ABSTRACT

In a semiconductor device manufacturing method, the step of calculating an exposure time of a photoresist includes (a) a step of deciding whether or not a variation of a line width of a device pattern 104 or a resist pattern 102*a* in a reference chip in a plurality of semiconductor wafers 101 that are manufactured in the past and have the same wafer information as an subject semiconductor wafer 101 is contained within a tolerance over a plurality of semiconductor wafers 101 in the past, and (b) a step of correcting the exposure time every chip by using an exposure correction table 22 if it is decided in the step (a) that the variation falls within the tolerance.

18 Claims, 13 Drawing Sheets

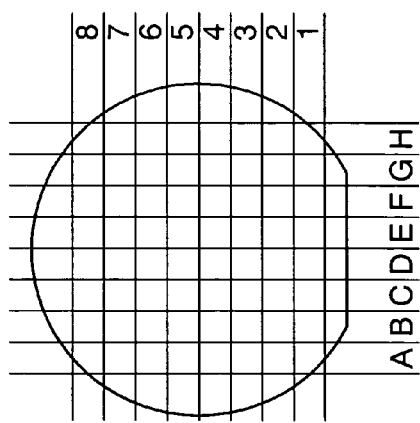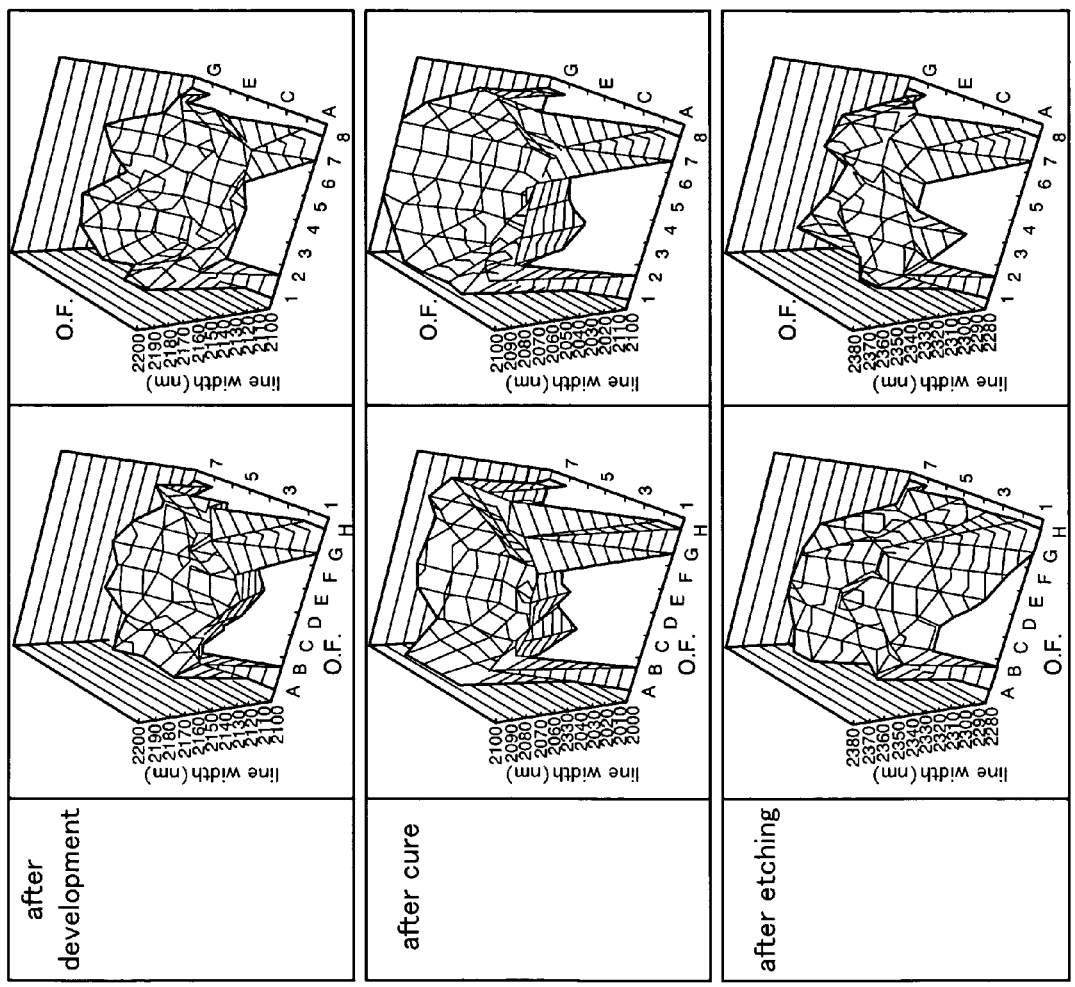
FIG. 3

FIG. 7 table No.3 / No.4 / No.5 / No.6

— wafer information — product type:***
layer:☐☐☐
kind of the photoresist: × × ×
etching condition : △△△
kind of the coater : ☆☆☆
spin coating condition:※※※

| | A | B | C | D | E | F | G | H |
|---|---|---|---|---|---|---|---|---|
| 8 | | | 2345.8 | 2332.9 | 2321 | 2311.7 | | |
| 7 | | 2340.5 | 2360.6 | 2333.3 | 2359.5 | 2352.8 | 2300.6 | |
| 6 | 2360.8 | 2336.5 | 2361.2 | 2357.6 | 2373.3 | 2320.9 | 2312.2 | 2309.6 |
| 5 | 2359.9 | 2344.5 | 2354.2 | 2356.7 | 2329.3 | 2341.1 | 2316 | 2270.4 |
| 4 | 2317.9 | 2354.3 | 2352.1 | 2366.5 | 2348 | 2347.6 | 2288 | 2291.8 |
| 3 | 2340.8 | 2363.8 | 2345.6 | 2356.7 | 2351.9 | 2357 | 2303.3 | 2291.5 |
| 2 | | 2352 | 2354.9 | 2338.6 | 2330.4 | 2341.1 | 2350.2 | |
| 1 | | | 2338.4 | 2338.5 | 2309.1 | 2297.3 | | |

9 uncorrected device pattern line width table

FIG. 8

| table No \ position of the chip | (A, 3) | (A, 4) | (B, 2) | ... | (C, 1) | (D, 1) | (D, 4) | (D, 8) | ... | (H, 4) | ... |
|---|---|---|---|---|---|---|---|---|---|---|---|
| #3 table | 2340.8 | 2317.9 | 2340.5 | ... | 2338.4 | 2338.5 | 2366.5 | 2332.9 | ... | 2291.5 | ... |
| #5 table | 2339.5 | 2317.8 | 2341.1 | ... | 2339.1 | 2337.9 | 2355.1 | 2335.1 | ... | 2292.3 | ... |
| #6 table | 2341.1 | 2317.1 | 2342.3 | ... | 2340.5 | 2340.1 | 2358.5 | 2333.5 | ... | 2293.5 | ... |
| #9 table | 2342.0 | 2318.1 | 2339.9 | ... | 2337.9 | 2339.5 | 2360.2 | 2334.8 | ... | 2292.4 | ... |
| #11 table | 2338.9 | 2317.5 | 2340.1 | ... | 2338.5 | 2339.7 | 2357.7 | 2332.1 | ... | 2293.9 | ... |
| #12 table | 2340.5 | 2317.4 | 2340.7 | ... | 2340.1 | 2341.5 | 2358.1 | 2333.9 | ... | 2294.1 | ... |
| #17 table | 2339.1 | 2318.2 | 2341.9 | ... | 2341.1 | 2340.0 | 2365.2 | 2332.5 | ... | 2294.0 | ... |
| average value $W_{AV}$ | 2340.3 | 2317.7 | 2340.9 | ... | 2339.4 | 2339.6 | 2360.2 | 2333.5 | ... | 2293.1 | ... |
| torelance of the line width ($0.9 W_{AV} \leq$ line width $\leq 1.1 W_{AV}$) | 2106.2 ~ 2338.9 | 2085.9 ~ 2317.1 | 2106.8 ~ 2339.9 | ... | 2105.4 ~ 2573.3 | 2105.6 ~ 2337.9 | 2124.2 ~ 2355.1 | 2100.2 ~ 2566.9 | ... | 2063.8 ~ 2291.5 | ... |
| maximum value of the line width | 2342.0 | 2318.2 | 2342.3 | ... | 2341.1 | 2341.5 | 2366.5 | 2335.1 | ... | 2294.1 | ... |
| minimum value of the line width | | | | | | | | | | | |
| Do the all of the line widths in the table reside in the tolerance ? | YES | YES | YES | ... | YES | YES | YES | YES | ... | YES | ... |
| target value $W_0$ of the line width | 2350.0 | 2350.0 | 2350.0 | ... | 2350.0 | 2350.0 | 2350.0 | 2350.0 | ... | 2350.0 | ... |

22 exposure correction table 7 corrected device pattern line width table 10 corrected device pattern line width table 6 uncorrected resist pattern line width table

SEMICONDUCTOR DEVICE MANUFACTURING METHOD AND SEMICONDUCTOR DEVICE MANUFACTURING SYSTEM

CROSS-REFERENCE TO RELATED APPLICATIONS

This application is based upon prior International Patent Application No. PCT/JP2003/005246, filed Apr. 23, 2003, the entire contents of which are incorporated herein by reference.

TECHNICAL FIELD

The present invention relates to a semiconductor device manufacturing method and a semiconductor device manufacturing system. More particularly, the present invention relates to a semiconductor device manufacturing method and a semiconductor device manufacturing system having the lithography step and the etching step used in the film patterning.

BACKGROUND ART

In manufacturing the semiconductor device such as LSI, or the like, the lithography step and the subsequent etching step are performed for the purpose of processing a film such as an insulating film, a conductive film, or the like into a desired shape. In the lithography step, the resist pattern is formed by coating a photoresist on the film and then exposing/developing the photoresist. Then, in the etching step, the device pattern is formed by etching the underlying film while using the resist pattern as a mask.

An exposure time in the lithography step exerts an influence on a line width of the resist pattern. Therefore, when an error is made in setting the exposure time, a line width of the final device pattern is deviated from a target line width and in turn a yield of the semiconductor device is lowered. For this reason, in order to conform the line width of the device pattern with the target one, various managing methods of the exposure time in the lithography step are proposed.

For instance, in Patent Literature 1, from the viewpoint that a variation of a pattern dimension of the exposed and developed photoresist is increased unless a time required from the end of the prebake of the photoresist to the start of the exposure is made constant, the variation of the pattern dimension is prevented by changing the exposure conditions.

However, the exposure conditions are not changed in each chip area on the same wafer. Therefore, it is impossible to prevent the unevenness of the line widths of the resist patterns, which is caused in respective chip areas in the same plane of the same wafer.

Also, in Patent Literature 2, the exposure amount on the wafer is set differently in the concentric distribution in the lithography step, and thus dimensions of the resist patterns are differentiated deliberately between the center portion and the peripheral portion of the wafer. According to this, it is asserted that a variation of a pattern dimension of the film due to a difference in an etching rate between the center portion and the peripheral portion of the wafer can be absorbed by a dimensional difference between the resist patterns, and thus the line width of the pattern formed after the etching is made uniform in the wafer plane.

However, it can be considered that the variation in the pattern dimension after the etching is not caused only by the difference in the etching rate and such variation may be caused by another factor. Also, it can be considered that the variation is not formed in a concentric fashion by a certain factor. In that case, such a situation may be supposed that, when the exposure amount distribution is formed concentrically, the variation of the pattern dimension after the etching is far from being absorbed at a certain portion of the wafer and, rather, such variation is amplified at that portion. Thus, there is a possibility that the pattern dimension is deviated largely from the target value.

In addition, in Patent Literature 2, focuses is made only on the variation of the pattern dimension in the wafer plane, and the variation in the lot consisting of plural wafers is not considered.

(Patent Literature 1)
Patent Application Publication (KOKAI) 2001-338865 (Paragraph No. 0025)
(Patent Literature 2)
Patent Application Publication (KOKAI) 2000-277423 (Paragraph Nos. 0015 to 0029)

DISCLOSURE OF THE INVENTION

It is an object of the present invention to provide a semiconductor device manufacturing method and a semiconductor device manufacturing system, capable of optimizing and reducing a variation of a line width of a pattern formed on a wafer by the lithography and the etching.

According to a first aspect of the present invention, there is provided a semiconductor device manufacturing method which comprises a step of forming a film on a semiconductor wafer from which multiple semiconductor chips are produced; a step of coating a photoresist on the film; a step of calculating an exposure time for the photoresist every semiconductor chip; a step of exposing a device pattern on the photoresist for the calculated exposure time; a step of developing the exposed photoresist and making the photoresist into a resist pattern; and a step of etching the film and making the film into a device pattern while using the resist pattern as an etching mask; wherein the step of calculating the exposure time includes (a) a step of deciding whether or not a variation of a line width of the device pattern or the resist pattern in a reference chip in a plurality of semiconductor wafers, which are manufactured in a past and have same wafer information as an subject semiconductor wafer, fall within a tolerance, and (b) a step of correcting the exposure time every chip by using an exposure correction table if it is decided in the step (a) that the variation is fall within the tolerance.

According to this, when it is decided that the variation of the line width of the device pattern or the resist pattern in the reference chip falls within the tolerance over a plurality of semiconductor wafers manufactured in the past, the process goes to the step (b), in which the exposure time of the semiconductor wafer is corrected every chip. The variation of the line width can be used as one criterion to decide whether or not the line width is distributed statistically stably in the wafers in the past. Therefore, the exposure time can be corrected with good precision by executing the correction of the exposure time after the variation is decided as above, and in turn a yield of the semiconductor device can be improved.

Moreover, before the step (a), a step of deciding whether or not the semiconductor wafers having the same wafer information as the subject semiconductor wafer are present in a plurality semiconductor wafer manufactured in the past in number to exceed a reference number may be executed as a step (c). By executing the step (c), such an event can be prevented that the reliability of the line width distribution is statistically lowered due to the small number of the semiconductor wafers that have the same wafer information as the subject semiconductor wafer in the past, and also the correction of the exposure time can be carried out with better precision.

Also, the chemically-amplified resist may be employed as the photoresist and, after the step of exposing the photoresist and before the step of developing the photoresist, the step of performing a baking (PEB: Post Exposure Bake) to the photoresist after exposure may be performed. In this case, the line width of the resist pattern varies depending on the type of the chemically-amplified resist or the wafer temperature during the PEB. Therefore, by employing the information containing at least one of the type of the resist and the wafer temperature during the PEB as the wafer information used in the above, the error in the line width of the device pattern caused due to these factors can be absorbed and thus the exposure correction can be made more precisely. Note that when information further containing the equipment using the PEB and the unit number of the equipment are employed as the above information, the accuracy of the exposure correction can be enhanced.

The wafer temperature during the PEB exerts a great influence on the chemically-amplified resist that uses the exposure light whose wavelength is shorter than KrF. Therefore, it is particularly preferable to employ the above wafer information when such chemically-amplified resist is employed.

In contrast, in the case of the photoresist that employs the I-line as the exposure light, the line width of the resist pattern varies depending on the wafer temperature applied when the resist pattern is cured by the ultraviolet rays. Thus, when the information containing the temperature in the curing are employed as the above wafer information, the error in the line width of the device pattern caused due to the curing can be absorbed and also the precise correction exposure time can be obtained.

Also, according to a second aspect of the present invention, there is provided a semiconductor device manufacturing system which comprises a coating equipment for coating a photoresist on a film on a semiconductor wafer from which multiple semiconductor chips are produced; an exposing equipment for exposing the photoresist; a developing equipment for developing the photoresist after exposure and making the photoresist into a resist pattern; a first line width measurement equipment for measuring a line width of the resist pattern; an etching equipment for etching the film to make the film into a device pattern while using the resist pattern as an etching mask; a second line width measurement equipment for measuring a line width of the device pattern; and a controlling means having a line width database in which at least one of a measured result of the first line width measurement equipment and the second line width measurement equipment is stored, an exposure correction database in which an exposure correction table is stored, and a calculating portion for calculating an exposure time in the exposing equipment every chip; wherein a line width table, which represents a line width distribution in an in-plane wafer of the resist pattern or the device pattern and is addressed by a wafer information of the semiconductor wafers manufactured in a past, is stored in the line width database, the calculating portion executes (a) a step of extracting a line width table that is addressed by same wafer information as an subject semiconductor wafer from the line width database, and then deciding whether or not a variation of a line width of the device pattern or the resist pattern in a reference chip in the extracted line width table is fall within a tolerance, and (b) a step of correcting the exposure time every chip by using an exposure correction table if it is decided in step (a) that the variation is fall within the tolerance, and the exposing equipment executes an exposure based on the exposure time that is calculated by the calculating portion every chip.

According to such semiconductor device manufacturing system, for the similar reasons to the first aspect of the present invention, the exposure time can be corrected with good precision and also a yield of the semiconductor device can be improved.

BRIEF DESCRIPTION OF THE DRAWINGS

FIG. 3 is three-dimensional graphs showing distributions of line widths of a resist pattern and a device pattern in a wafer plane measured by the CD-SEM respectively when the embodiment of the present invention is not applied;

FIG. 7 is a view showing an example of an uncorrected device pattern line width table used in the embodiment of the present invention;

FIG. 8 is a view schematically representing calculation contents of a CPU in the embodiment of the present invention;

BEST MODE FOR CARRYING OUT THE INVENTION

An embodiment of the present invention will be explained with reference to the drawings hereinafter.

Figure 1:
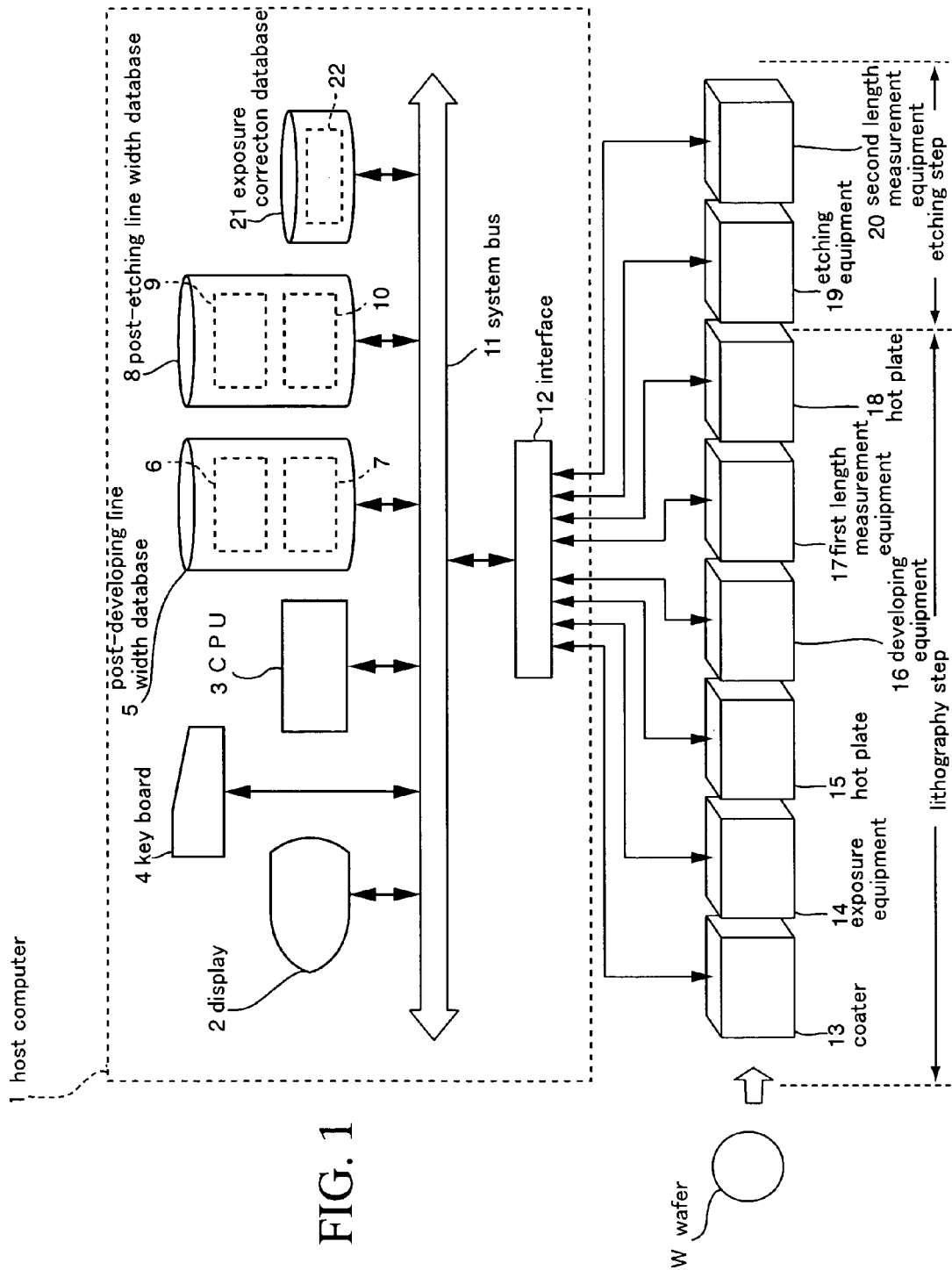
FIG. 1 is a configurative view of a semiconductor device manufacturing system according to an embodiment of the present invention.
Figure 2:
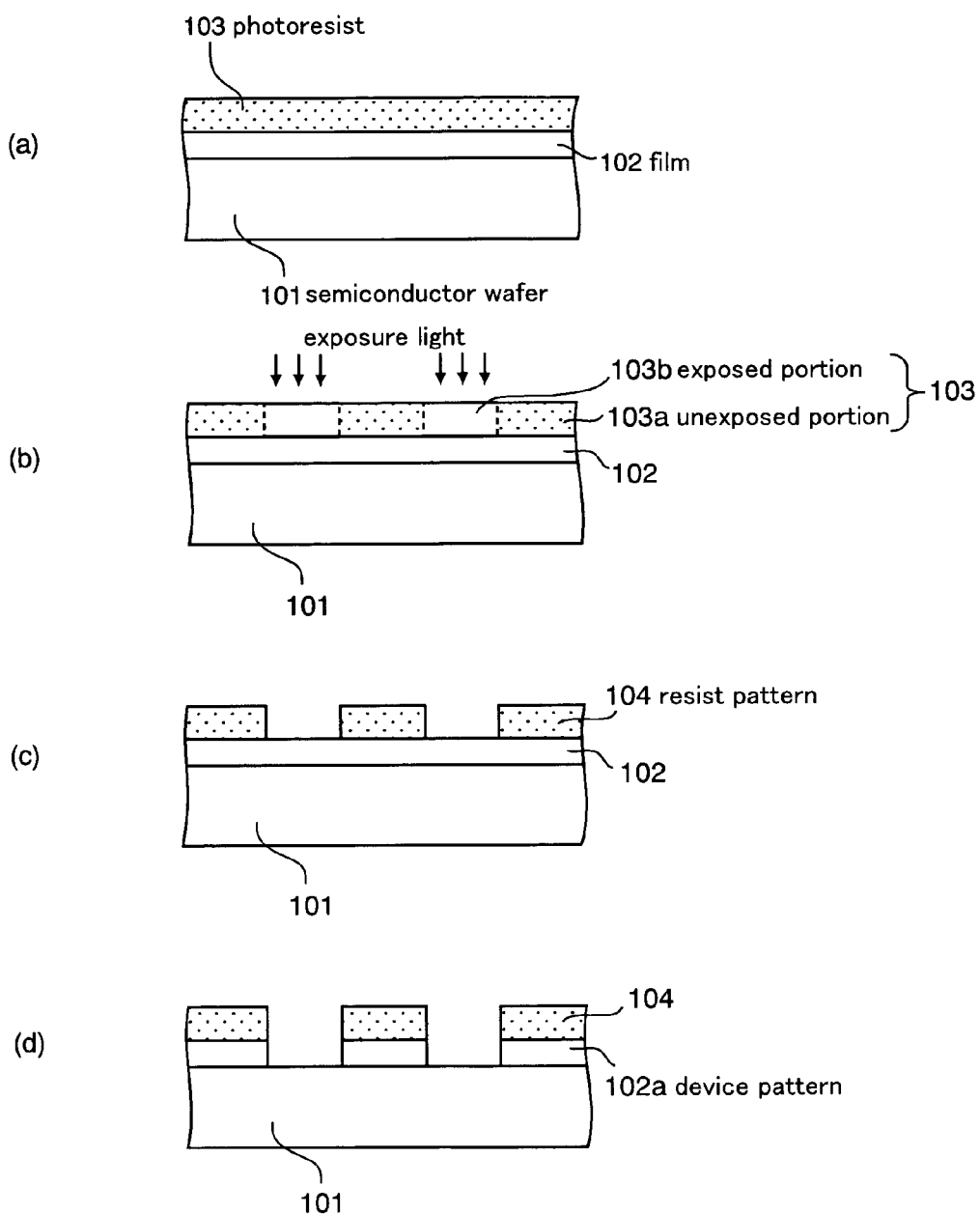
FIGS. 2(a) to (d) are sectional views showing a semiconductor device manufacturing method according to an embodiment of the present invention in order of step.

FIG. 1 is a configurative view of a semiconductor device manufacturing system according to the present embodiment.

When a semiconductor wafer W is introduced into the lithography step, the wafer W is put into a coater (coating equipment) 13 and coated with a photoresist. Then, the wafer W is put into an exposing equipment 14 such as a stepper, or the like. Then a wiring pattern, or the like, is projected onto each chips of the wafer W by shot to shot. It should be noted that scanner may be employed as the exposing equipment in place of the stepper.

Then, the wafer is subjected to a baking after the exposure (PEB: Post Exposure Bake) on a hot plate 15, and then the photoresist is developed by a developing equipment 16 to form a resist pattern. A line width of the resist pattern is measured by a first line width measurement equipment 17 to decide whether the line width of the resist pattern coincides with a target dimension. As the line width measurement equipment, a CD-SEM (Critical Dimension Scanning Electron Microscope) may be employed or the optical line width measurement equipment, which uses optical ellipsometry technology, may be employed. Then, at the end of the lithography step, the resist pattern is cured on a hot plate 18 while irradiating the ultraviolet rays.

The wafer W is moved to the etching step after the lithography step. Then, films such as an insulating film, a conductive film, etc. are etched in an etching equipment 19 while using the resist pattern formed in the etching step as a mask. Thus, a device pattern is formed by the remaining films that are not etched. Thereafter, the line width of the pattern is measured in a second line width measurement equipment 20 to investigate whether the resultant device pattern has the target dimension. The second line width measurement equipment may be substituted for the first line width measurement equipment 18 that is used in the lithography step, and may either be CD-SEM or optical line width measurement equipment.

Each of the semiconductor manufacturing equipments 13 to 20 being employed in the lithography step and the etching step are controlled by a host computer (controlling means) 1, and their operations are managed by the operator.

The host computer 1 has an interface 12 via which the data are input/output into/from the semiconductor manufacturing equipments 13 to 20 in a predetermined signal format respectively. Line width data, which are captured on the host computer 1 from the first and second line width measurement equipments 17 and 20 via the interface 1, are captured on a resist pattern line width database (first line width database) 5, a device pattern line width database (second line width database) 8, and the like via a system bus 11. Details of the data stored in these databases 5, 8 will be described later.

Respective states of the semiconductor manufacturing equipments 13 to 20, a history of the wafer, etc. are displayed on a display 2 that is connected to the system bus 11, which allows an operator to grasp current overview of the steps. Then, the instruction to the host computer 1 is issued when the operator operates a keyboard 4 connected to the system bus 11.

A CPU (calculating portion) 3 is connected to the system bus 11. The CPU 3 has a function of executing logical operations necessary for the controlling the semiconductor manufacturing equipments 13 to 20, and a function of managing operations of the display 2, the keyboard 4, the post-development line width database 5, and the post-etching line width database 8.

Next, the semiconductor device manufacturing method using the system in FIG. 1 will be explained hereunder. FIGS. 2(a) to (d) are sectional views showing the semiconductor device manufacturing method according to the present embodiment in order of step.

First, steps performed for obtaining a sectional structure shown in FIG. 2(a) will be explained hereunder.

Using CVD (Chemical Vapor Deposition) method, an $SiO_2$ film is formed to the thickness of about 300 nm on the semiconductor wafer 101 like silicon wafer, as a film 102 which is patterned and made into device pattern in later step. It should be noted that BARK (Bottom Side Antireflective Coating) may be coated on the semiconductor wafer 101 in advance or TARK (Top Side Antireflective Coating) may be coated on the film 102 as a reflection preventing film to prevent a reflection of an exposure light.

Although not limited, it is preferable that a 6-inch, 8-inch, or 12-inch silicon wafer, from which multiple chips are to be produced, be employed as the semiconductor wafer 101. FIG. 2(a) and subsequent sectional views are sectional views that show one chip on such silicon wafer.

Thereafter, a photoresist 103 is coated on the film 102 by dripping the chemically-amplified positive resist of about 1 to 2 cc on the film 102 while rotating the semiconductor wafer 101 contained in the coater 13 in FIG. 1 at the rotating speed of 3000 rpm. Note that the coating conditions in the coater 13 are not limited to this condition and may be optimized variously.

Then, the semiconductor wafer 101 is carried into the exposing equipment 14 and the photoresist 103 is exposed therein. In the present embodiment, the stepper is used as the exposing equipment 14, and the pattern is projected on the semiconductor wafer 101 from chip to chip by single shot.

According to this, as shown in FIG. 2(b), exposed portions 103b having an exposure pattern profile are formed on the photoresist 103, and remaining areas of the photoresist 103 are not exposed to light and remain as unexposed portion 103a. As described above, since the photoresist 103 is the chemically-amplified resist, the acid is generated in the exposed portions 103a on which the exposure light is irradiated.

After that, the semiconductor wafer 101 is carried onto the hot plate 15 in FIG. 1, and then the photoresist 103 is baked in the atmosphere, which is subjected to the environmental control by removing the amine, by setting a substrate temperature to 120° C. This baking is also called as PEB (Post Exposure Baking) and is performed to accelerate the generation of the acid in the exposed portions 103b.

Then, the photoresist 103 is developed in the developing equipment 16 in FIG. 1. Thus, as shown in FIG. 2(c), the exposed portions 103b in which the acid exist are removed, and the remaining unexposed portions 103a are used as resist patterns 104.

Then, in order to investigate whether the line width of the resist patterns 104 has the target value, the semiconductor wafer 101 is carried into the first line width measurement equipment 17 in FIG. 1, and then the line width of the resist patterns 104 is measured therein.

Thereafter, in order to perfectly crosslink the resist patterns 104, the semiconductor wafer 101 is carried onto the hot plate 18 in FIG. 1 and the resist pattern 104 are heated to be cured while irradiating the ultraviolet rays therein.

Subsequently, the semiconductor wafer 101 is loaded into an etching chamber (not shown) of the etching equipment 19 in FIG. 1. The type of the etching chamber is not particularly limited, and the RIE (Reactive Ion Etching) chamber, or the like may be employed, for example. Then, as shown in FIG. 2(d), device pattern 102a are formed by etching the underlying film 102 while using the resist pattern 104 as a mask.

The device pattern 102a, although not particularly limited, is wiring pattern, capacitor dielectric film pattern, and the like, for example.

Thereafter, the resist pattern 104 is ashed to be removed by applying the ashing in the oxygen atmosphere, for example.

Meanwhile, when making attention on the same portion of the all of the chip in the semiconductor wafer 101, the device patterns 102 need to have same line width. Therefore, the inventors of this application investigated how the line width distributed in the plane of the semiconductor wafer 101. The investigated results are given in FIG. 3.

FIG. 3 is three-dimensional graphs showing the result of distributions of the line widths of the resist pattern 103 and the device pattern 102a in the wafer plane measured by the CD-SEM. In each of the graphs, X, Y coordinates denote positions of the chip in the wafer shown on the right side in FIG. 3, and Z coordinate denotes the line width.

The graph shown in the "after development" column represents the line width distribution in the wafer plane of the resist pattern 104 obtained by developing the photoresist 103, and the graph shown in the "after cure" column represents the line width distribution of the resist pattern 104 after the resist pattern 104 is cured. Also, the graph shown in the "after etching" column represents the line width of the device pattern 102a, which is to be the final managed object.

Here, in each graphs, "O.F" denotes the direction in which an orientation flat of the wafer is directed. Although two graphs are illustrated in each of the "after development", "after cure", and "after etching" columns, the graph on the right side is obtained by rotating the graph on the left side clockwise by 90 and both graphs show the measured results of the same wafer.

Comparing "after development" and "after cure" in FIG. 3, line width distributions of the resist pattern 104 in both graphs exhibit the almost same tendency in the wafer plane. In contrast, when looking at the line width distribution of the device pattern 102a shown in "after etching", the distribution exhibits a different tendency from those of the resist pattern 104 shown in "after development" and "after cure".

The line width of the device pattern 102a shown in "after etching" is narrow in the chips in the peripheral portion of the wafer and wide around the center of the wafer, which shows that line width does not distribute uniformly over the entire surface of the wafer. Therefore, the line width of the device pattern 102a must be formed to have the same value in all chips of the wafer by differentiating the exposure amount of the stepper every chip in a manner described later.

Figure 4:
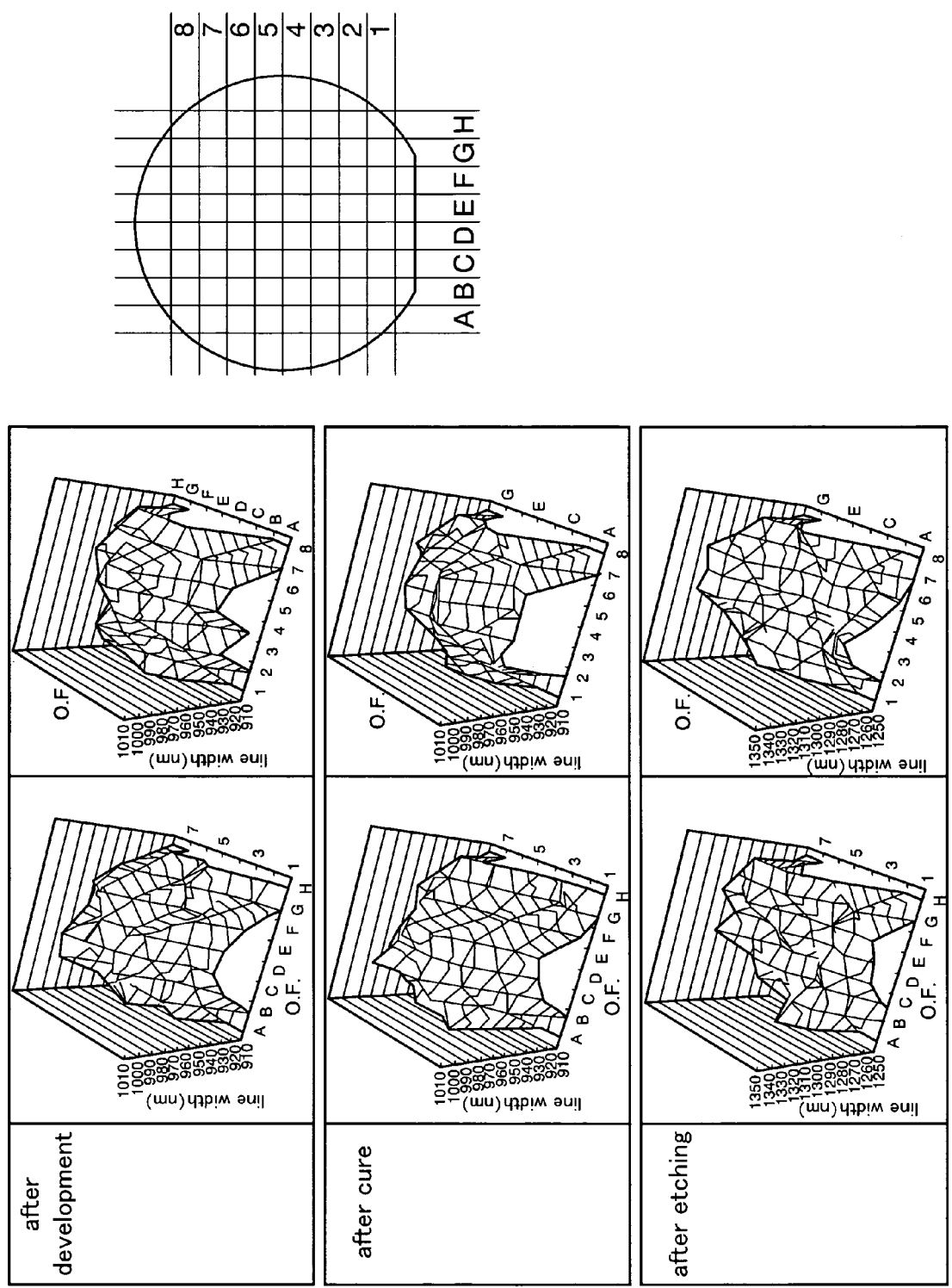
FIG. 4 is three-dimensional graphs showing distributions of line widths of a resist pattern and a device pattern in a wafer plane of a semiconductor wafer, on which a chip of a type different from FIG. 3 is gang-printed, measured by the CD-SEM respectively when the embodiment of the present invention is not applied.

FIG. 4 is three-dimensional graphs obtained by making the same investigation as that in FIG. 3 on the wafer on which the chip of a type different from FIG. 3 is manufactured.

Comparing FIG. 3 and FIG. 4, it can be understood that distribution of the ultimate device pattern 102a differs when different type of chip is employed.

This is because the photoresist 103, the coater 13, the hot plates 15, 18 that are employed are different in the wafer of the different type, and thus variation components of these material and the equipments environment appear in different forms in the wafer of the different type. It should be noted that although the difference in the type is considered here, the in-plane distribution of the device pattern 102a shows the different tendency even in the same type, as described above, if the layer of the device pattern 102a is different. The different layers in the same type are meant to such layers as the first and second level wiring layer in the same chip, wiring layer and interlayer insulating layer, for example.

Moreover, it can be understood from the "after etching" graph shown in FIG. 4, i.e., the distribution of the device pattern, that the line width does not distribute in the concentric manner with respect to the center of the wafer. Therefore, the method set forth in Patent Literature 2, which changes the exposure amount in the concentric manner on the assumption that the line width distribution is formed in the concentric manner, is not effective for the device pattern 102a that exhibits the line width distribution shown in FIG. 4.

Figure 5:
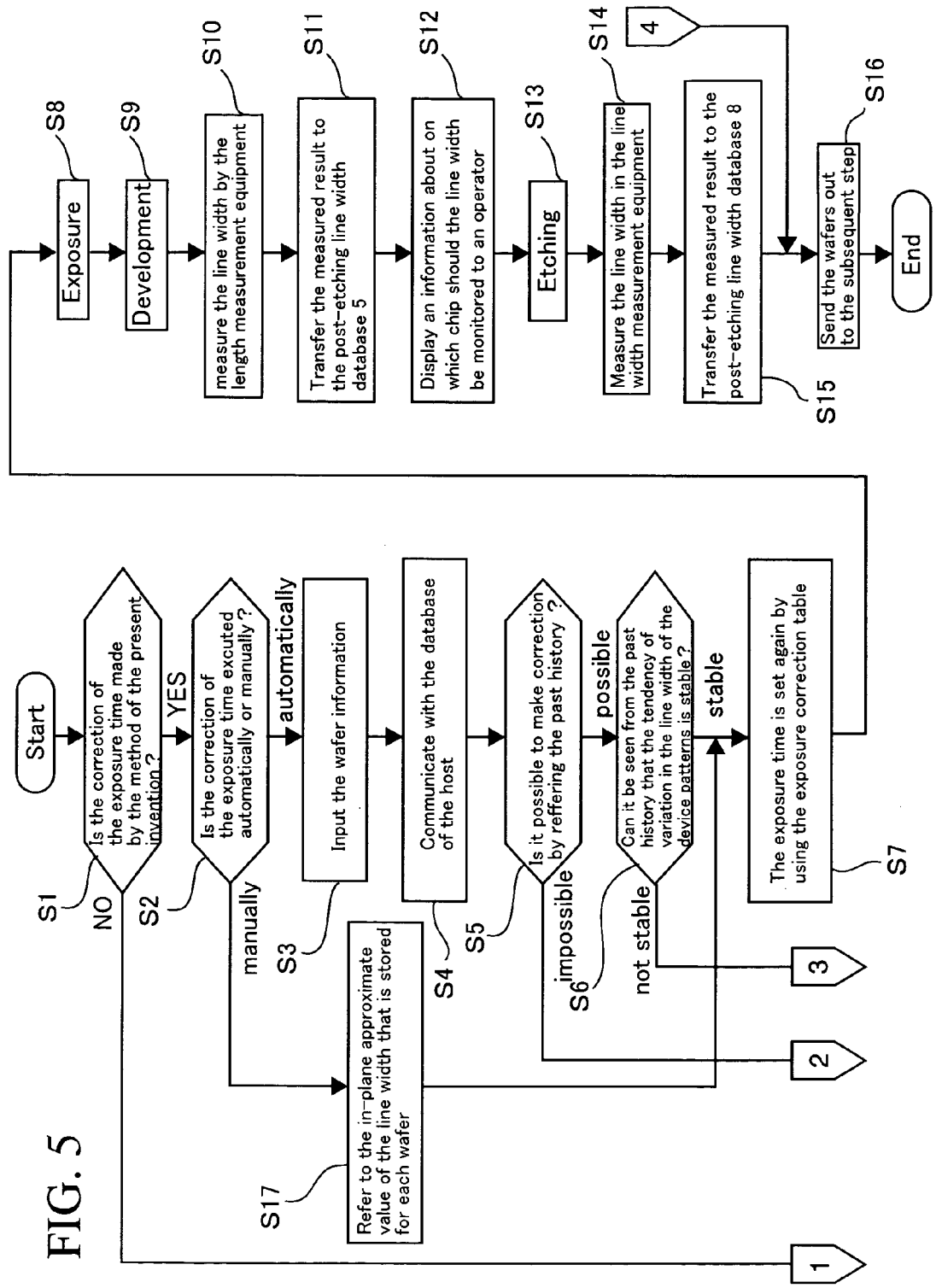
FIG. 5 is a flowchart (#1) showing the semiconductor device manufacturing method according to the embodiment of the present invention.
Figure 6:
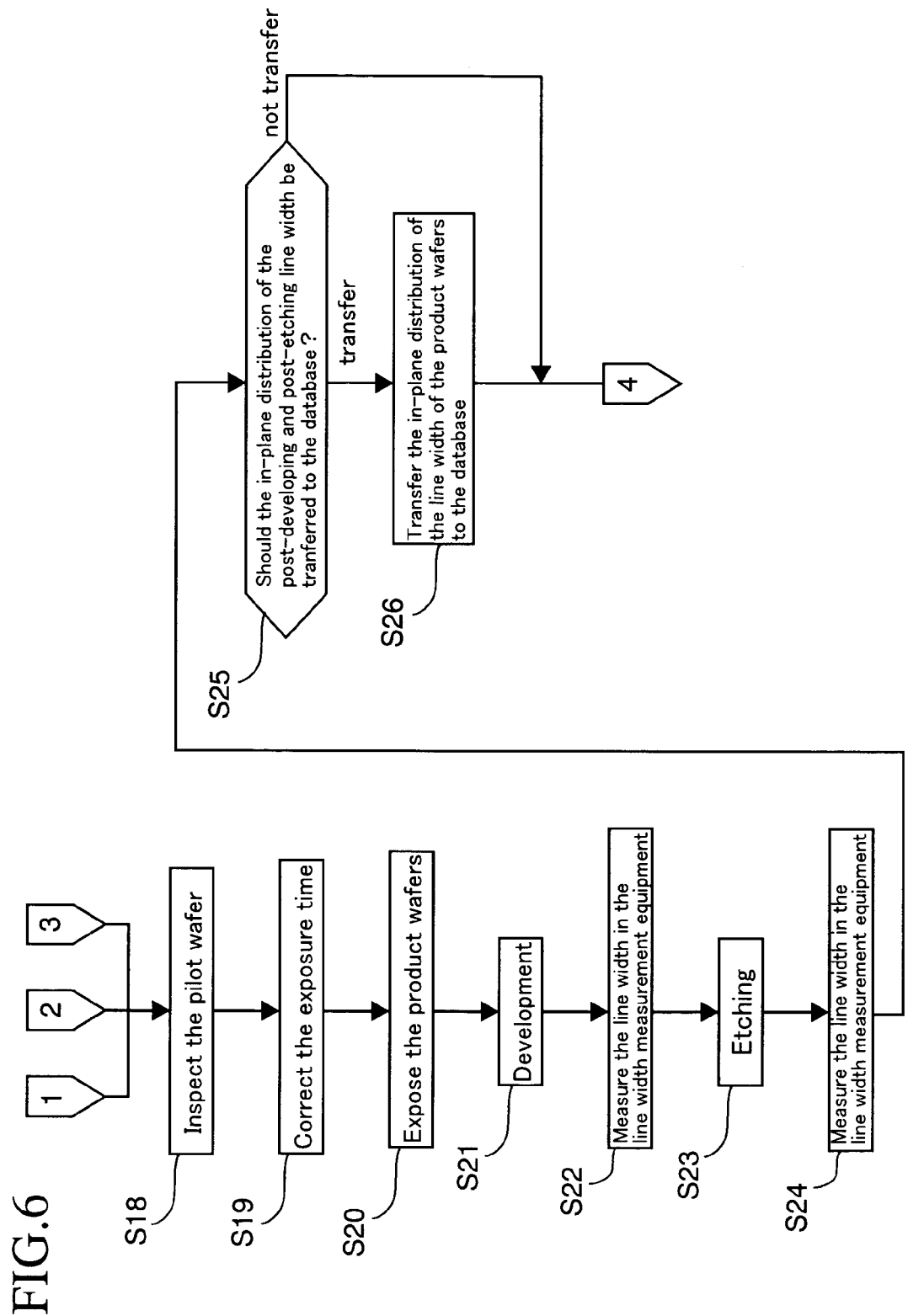
FIG. 6 is a flowchart (#2) showing the semiconductor device manufacturing method according to the embodiment of the present invention.

Following such consideration, in order to correct the line width to the almost same value in the wafer plane irrespective of the manner in which the device pattern 102a distributes, present embodiment corrects the exposure amount in accordance with the flowchart shown in FIG. 5 and FIG. 6.

FIG. 5 and FIG. 6 are a flowchart showing the semiconductor device manufacturing method according to the present embodiment, and are views showing process procedures applied to the wafer that is taken out from the coater 13 in FIG. 1. Also, for convenience of explanation, FIG. 1 and FIG. 2 being already described will be also referred to in the following.

First, the photoresist 103 is coated on each wafers by applying the steps shown in FIG. 2(a) to the wafers in one lot. The number of wafers contained in one lot is not limited. For example, the number of wafer in one lot is 25, made up from 24 product wafers and 1 pilot wafer.

Then, in step S1, it is decided whether the correction of the exposure time in the exposing equipment 14 is made by the method of the present invention. This decision is made by the operator who operates the keyboard 4 while looking at the display 2.

In step S1, the exposure correction is decided to be not made for such case where the lot to be fed from now is the new type, for example. This is because, if the exposure correction of the present embodiment is applied to the new type, the line width distribution having a new tendency, which has not been stored in the databases 5, 8 up to now are transferred to the databases 5, 8, as described below, and thus the tendency of the data in the databases is disturbed.

As such, it is preferable to decide that the correction is not made (NO) for the new type and go to the normal process described later.

In contrast, in step S1, the exposure correction is decided to be made for such case where the lot to be fed is the existing type that is fed to the exposure step many times in the past. In this case, it is expected that the line width distribution having the same tendency as the line width distributions stored in the databases 5, 8 can also be obtained in this lot. Therefore, even if the line width distribution is transferred to the databases 5, 8, the tendency of the data in the databases is not disturbed.

If it is decided that the correction is made (YES) in step S1, the process goes to step S2. Then, it is decided whether the correction of the exposure time is executed automatically by the host computer 1 in FIG. 1 or executed manually by the operator independently of the host computer 1. Like step S1, this decision is also made by the operator who operates the keyboard 4 while looking at the display 2.

The case where the exposure time is corrected manually includes such case where the subject wafer is sporadically fed into the exposure step for the purpose of development or experiment. This is because the tendency of the data in the databases 5, 8 is disturbed for the same reason as explained in step S1 when the correction is automatically made for such wafer. Also, the wafer fed for developing purposes or experimenting purposes is seldom fed in unit of one lot like the product wafer and, rather, such wafer is fed to the exposure step only in unit of one sheet or several sheets. Therefore, such wafer cannot be fed to the normal process of the product wafer and thus the exposure correction must be made manually.

In contrast,

The case where the exposure time is corrected automatically includes such case where, like in step S1, the subject wafer is the existing type that is fed into the exposure step many times in the past. In this case, for the same reason as explained in step S1, the tendency of the data in the databases 5, 8 is not disturbed.

If it is decided in step S2 as "automatically", the process goes to step S3, and the information of the wafer to be fed from now are input into the host computer 1. As the input information, various information that exert an influence on the wafer-in-plane distribution of the line width of the final device pattern 102a may be employed. Such information includes, for example, product type, layer, kind of the photoresist 103, etching conditions, kind of the coater 13, spin coating conditions in the coater 13, wafer temperature in PEB, and wafer temperature in the cure of the photoresist 103.

This inputting operation is executed by the operator who operates the keyboard 4 while monitoring the display 2. Also, since the wafer information are common to all of the 25 sheets of wafer in one lot, the operator may input the wafer information into one lot only once. Here, if the wafer information are contained in advance in the bar code used in the production line instead of such manual inputting, the wafer information may be input automatically by reading the bar code.

Next, the process goes to step S4, and the CPU 3 communicates with the device pattern line width database 8 based on the information input in step S3.

Here, a plurality of line width distributions of the device pattern 102a collected when the exposure amount correction was not made in the past by the method of the present invention are stored in the line width database 8 in the form of a table 9 (referred to as an "uncorrected device pattern line width table" hereinafter). An example of the uncorrected device pattern line width table 9 is shown in FIG. 7, where the above described wafer information serve as addresses for each of the tables, and table number is affixed to each tables.

Then, when one of the addresses, i.e., the wafer information is designated, the table 9 that coincides with the conditions contained in the wafer information is extracted. Each of the extracted tables 9 represents the in-plane distribution of the line width of the device patterns that are formed in the past in compliance with the wafer information.

The in-plane distribution of the line width is the one obtained by assigning the line width at a representative point in each of the chips to all of the chips in the wafer as shown in FIG. 7. The representative point is, for example, an identical point to all of the chips, such as central point of the chips.

Since the table 9 and the wafer represented by this table corresponds to each other on a one-to-one basis, the table 9 is referred simply to as the wafer in the following in some cases.

In step S4, the table that coincides with the input wafer information is read in this manner. In the case where a large number of wafers having the same type as the subject wafer were fed in the past, it can be expected that there are a large number of tables 9 that is read in his manner. In contrast, in the case where few wafers of the same type as the subject wafer are fed in the past, the number of the read tables 9 decreases.

When the number of the read tables 9 is large, the reliability of the line width distribution in the table 9 can be statistically improved. Therefore, the exposure amount can be corrected with good precision based on the line width distribution in the read table 9.

In contrast, when the number of the read tables 9 is small, the reliability of the line width distribution is statistically lowered. Therefore, the correction of the exposure amount becomes rough if the correction is made based on such table 9.

In this manner, the number of the tables 9 read in step S4 serves as one of standards to decide whether or not the correction of the exposure amount of the wafers, which are being fed from now, can be made with good precision based on the tables 9 stored in the database 8 in the past.

In view of this, the process goes to step S5 after step S4 is ended. In the step S5, the number of the tables 9 extracted in step S4 is counted, and then it is decided whether or not the count value exceeds a standard value. If it is decided that the count value of the extracted tables 9 is larger than the standard value, it is decided that the precise correction of the exposure amount can be made based on the database stored in the past. Also, if it is decided that the count value is smaller than the standard value, it is decided that the precise correction of the exposure amount cannot be made based on the past database, and, the process goes to the normal exposure process as described later.

The standard value employed at this time is not particularly limited. For example, the standard value is set to five or more, for example.

Then, if it is decided that the correction can be made (YES) in step S5, the process goes to step S6.

In step S6, a plurality of reference chips, e.g., five chips in total consisting of one chip located in the center of the wafer and four chips located at the peripheral portion of the wafer, are extracted from each table read in step S4. As indicated by a thick line in FIG. 8, positions of five chips are (D,4) located in the almost center of the wafer and four points (A,4), (D,1), (D,8), (H,4) located at the peripheral portion of the wafer. Also, the same chips must be employed as these chips in respective extracted tables.

After the reference chip is extracted in this manner, the line width in the position (A,4) is extracted from the extracted tables, as shown in FIG. 8. FIG. 8 is a view schematically representing calculation contents of the CPU 3. In this example, seven tables having the table number 3, 5, 6, 9, 11, 12, 17 are extracted in total in step S4, and the line width in each tables is extracted as illustrated.

Then, an average value $W_{AV}$ is calculated by computing an average of the line widths in this position (A, 4) in each tables. Then, a range that is within ±110% of the average value $W_{AV}$ is calculated and then this range is set as a tolerance of the line widths in this position (A,4). Next, a maximum value and a minimum value of the line widths in the extracted table are calculated. Then, it is decided whether or not the line widths in this position (A,4) are within the tolerance in all extracted tables, by deciding whether or not these maximum and minimum values are within the tolerance.

Moreover, the same procedures as above are also applied to other chip positions ((A,3), (B,2), . . . ). Then, it is decided whether or not the line widths in these positions are within the tolerance.

Here, if the line width is out of the tolerance in at least one of five reference chips that are extracted, it is decided that the line widths of the device pattern 102a are distributed at random over the extracted tables. In this case, since the distribution of the line width in the extracted tables is not statistically stabile, the exposure amount cannot be corrected with good precision by using the tables. Therefore, it is dangerous to make the correction of the exposure amount automatically in this case, and hence the process goes to the normal exposure process described later.

In contrast, if the line widths in five reference chips are distributed completely within the tolerance, it is decided that the line widths of the device patterns are varied statically stably in the extracted tables, and then the process goes to step S7. In the example in FIG. 8, since the line widths are distributed within the tolerance in all five reference chip positions (D,4), (A,4), (D,1), (D,8), (H,4), it is decided that such variation is stable, and hence the process goes to step S7.

In step S7, the CPU 3 communicates with an exposure correction database 21 to extract an exposure correction table 22 that coincides with the wafer information input in step S3.

Figure 9:
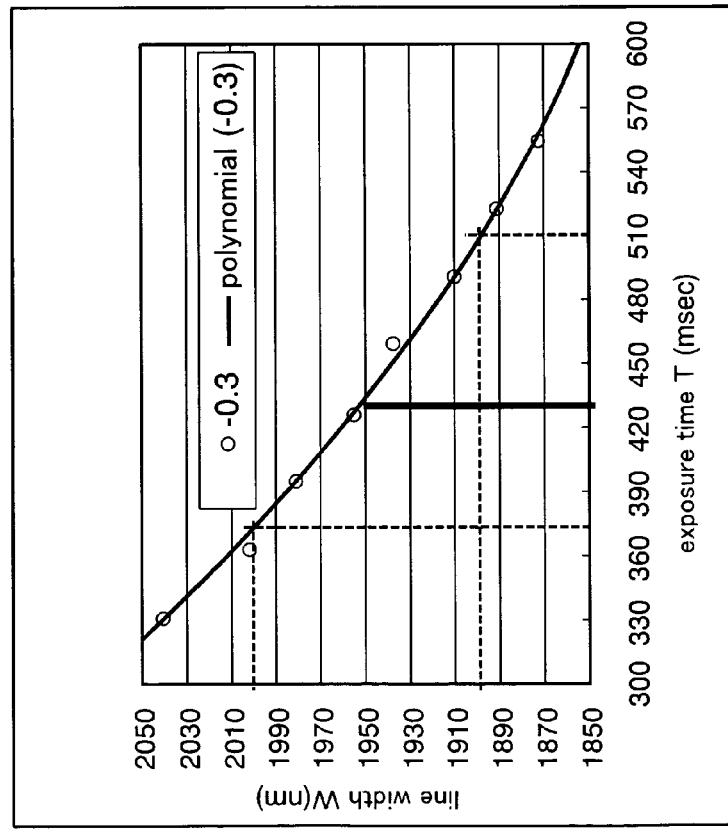
FIG. 9 is a view showing an example of an exposure correction table used in the embodiment of the present invention.

FIG. 9 is an example of the exposure correction table 22. In the table 22, an exposure time T, as well as the line width W of the device pattern that is obtained when the exposure is made through the exposure time T, are stored with a correspondence relation W=f(T). Each table is addressed by the wafer information. In this example, f is approximated by a finite degree polynomial of T. Also, the table in FIG. 9 is extracted by executing the addressing using the same wafer information as the wafer already shown in FIG. 3.

Figure 10:
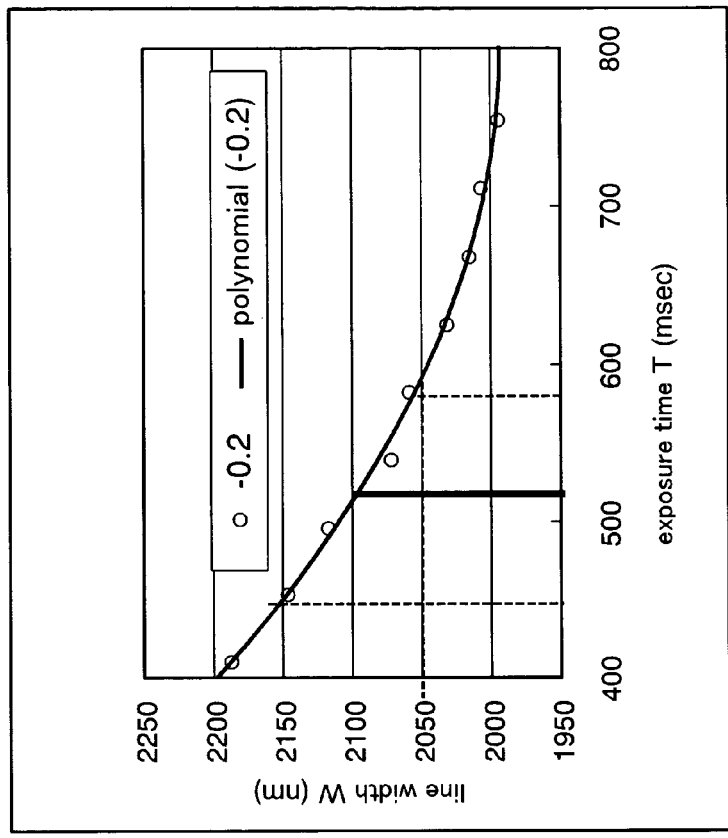
FIG. 10 is a view showing an example of an exposure correction table for a wafer of a type different from FIG. 9, used in the embodiment of the present invention.

In contrast, FIG. 10 shows the exposure correction table 22 that is extracted by executing the addressing using the same wafer information as the wafer already shown in FIG. 4. Since the type of the wafer is different from that shown in FIG. 9, the exposure correction table indicates a gentle gradient in contrast to FIG. 9. The reason why the table has the different gradient in this manner is that NA (Numerical Aperture), a size of a diaphragm, etc. of the exposure equipment are different from FIG. 9 when the conditions contained in the wafer information, e.g., the type, etc. are different, and thus an exposure margin is different from that shown in FIG. 9.

Prior to the setup of the host computer 1, each tables 22 are formed by varying the exposure amount variously based on the conditions contained in the given wafer information (type of the product, layer, type of the photoresist 103, etching condition, type of the coater 13, spin coating condition in the coater 13, etc.) to vary the line width of the device pattern, and then measuring the line width by means of the line width measurement equipment. Then, resultant tables 22 are stored in the exposure correction database 21 when the host computer 1 is set up.

The CPU 3 executes the correction of the exposure amount in all chips in the wafer as follows based on the past history of the exposure amount, while using the exposure correction table 22.

For example, suppose that a design value $W_0$ of the line width of the device pattern 102a is 1950 nm and the average value $W_{AV}$ of the line width is 1890 nm in a certain chip. In such case, an average exposure time $f^{-1}(W_{AV})$ in the past is given as 520 msec. Thus, it is understood that the exposure time $f^{-1}(W_{AV})$ becomes longer (over dose) than the exposure time $f^{-1}(W_0)$ 430 msec for obtaining the design value 1950 nm, by a difference $f\!\!\!/T=f^{-1}(W_{AV})-f^{-1}(W_0)$. Therefore, in this case, the proper exposure time 430 msec, required to get the target line width 1950 nm, can be calculated by subtracting $f\!\!\!/T(=90$ msec) from the average exposure time $f^{-1}(W_{AV})$ (=520 msec) in the past.

In step S7, CPU 3 performs such calculation for all of the chips in wafer, and thus the correction of the exposure time is made for all of the chips.

The above explanation is made for the case where it is decided in step S2 that the exposure correction is made automatically. In contrast, if the subject wafer is the one that is prepared for developing purposes or experimenting purposes, or if it is decided in step S2 that the exposure correction is made manually, the process goes from step S2 to step S17.

In step S17, the exposure correction table 22 that is closest to the wafer information of the subject wafer is referred to. As the exposure correction table 22, the table stored in the exposure correction database 21 may be employed or the table saved in the exposure step in the form of a hard copy or an electronic file may be employed. Then, references applied in selecting the table that is closest to the wafer information of the subject wafer from the exposure correction tables are decided based on the operator's experience or the operator's intuition.

After the exposure correction table is selected manually in this manner, above described operation of the step S7 is executed manually to perform the correction of the exposure amount.

Even when either of "manually" and "automatically" is selected in step S2, the process goes to step S8 after step S7 is ended.

In step S8, the wafers contained in one lot are fed to the exposing equipment 14 one by one and then the photoresist 103 is exposed on each chip with a single shot. At this time, the exposure time calculated in step S7 is employed as the exposure time of each shot.

Thereafter, the wafer in one lot is carried onto the hot plate 15 in FIG. 1 and then PEB is applied to the photoresist 103 of each wafer. This PEB is carried out at the wafer temperature of 120° C. in the atmosphere that is subjected to the environmental control by removing the amine.

Next, the process goes to step S9. All wafers in one lot are put into the developing equipment 16 to develop the photoresist 103, and thus the resist pattern 104 is formed on all wafers.

Then, the process goes to step S10, and the line width of the resist pattern 104 is measured by the first line width measurement equipment 17 such as CD-SEM, or the like. This measurement is applied to the representative points of all chips in all wafers.

Figure 11:
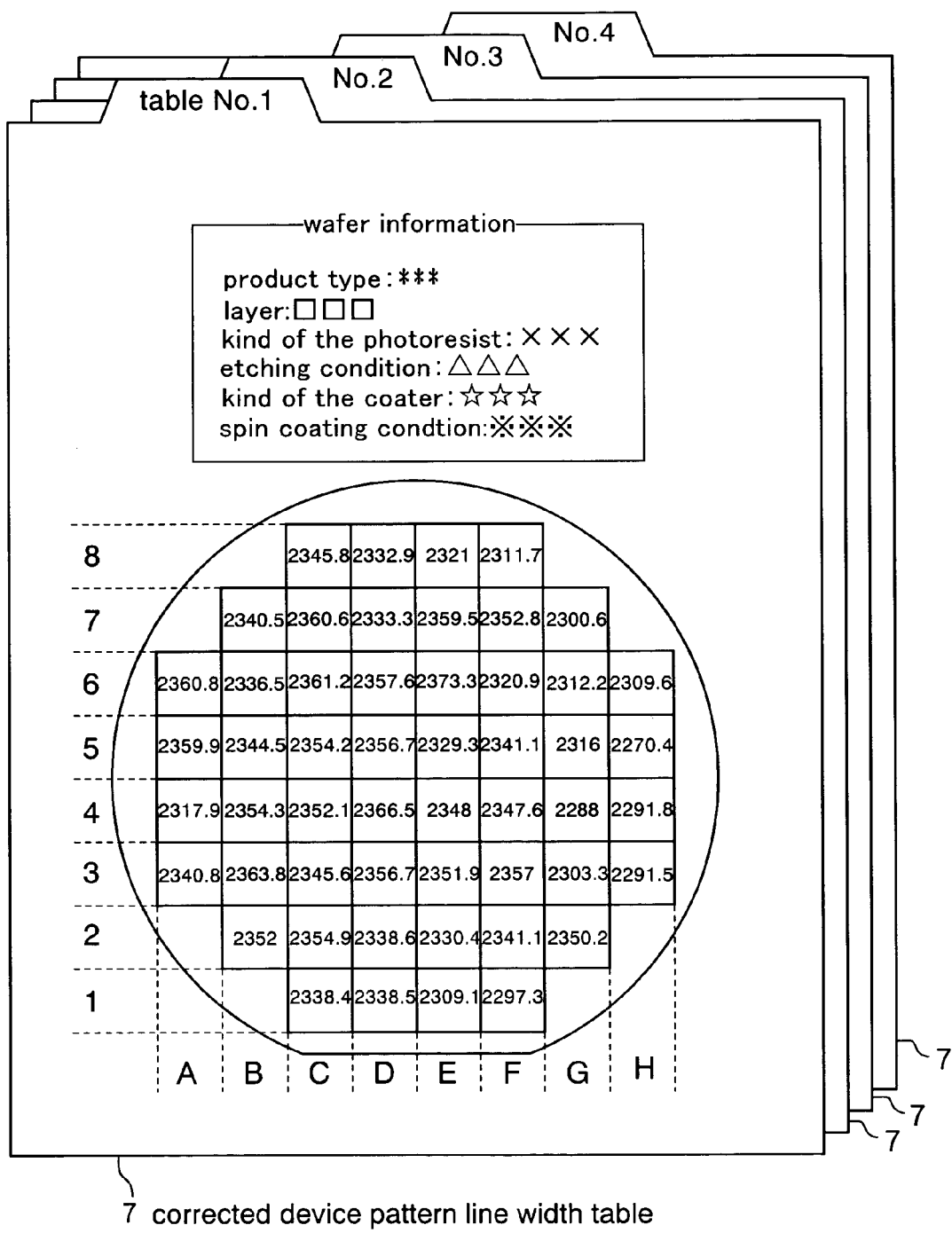
FIG. 11 is a view showing an example of a corrected resist pattern line width table used in the embodiment of the present invention.

Then, the process goes to step S11. Then, the line widths of the resist patterns of respective wafers measured in step S10 are transferred to the resist pattern line width database 5. According to this transmission, a table 7 shown in FIG. 11 (referred to as an "corrected resist pattern line width table" hereinafter) is stored one by one in the database 5 every wafer. In this corrected resist pattern line width table 7, the above wafer information serves as the address and the table number is designated to respective tables. Then, each table 7 contains the in-plane distribution of the line width of the resist pattern as the data.

By the way, in the present embodiment, the line width of the final device pattern 102a is to be brought close to the design value. However, as shown in FIG. 3, the line width distribution of the device pattern 102a and the line width distribution of the resist pattern 104 do not always have the same tendency. Therefore, in some cases, the device pattern 102a having the target line width can be formed even by using the resist pattern 104 having the line width that is deviated largely at a glance from the line width of the target device pattern 102a. In this event, unless the operator who manages the steps does not know this fact, it may be happened that the operator falsely decides the device pattern 102a as the defective one when the device pattern 102a having the line width that is deviated largely from the line width of the resist pattern 104 is fed to the operator.

Therefore, in step S12, the tolerance of the line width of the resist pattern 104 and the measured value measured in step S10 in respective wafers in one lot are displayed on the display 2. For example, the case where the target value of the line width of the final device pattern 104 is 300 nm and Etch Shift (the line width of the device pattern 104—the line width of the resist pattern 102a) is −50 nm is considered. In this case, since the line width of the device pattern 104 does not coincide with the target value 300 nm unless the line width of the resist pattern 102a is finished to 350 nm, a massage indicating that the target value of the line width of the resist pattern 102a is 350 nm is displayed on the display 2. Furthermore, a predetermined width is provided to the target value of this line width, and such width is displayed on the display 2 as the tolerance of the line width of the resist pattern 102a.

Because the tolerance is displayed in this way, the operator can decides based on the displayed information whether the line width of the resist pattern 104 falls within the tolerance. Thus, there is no possibility that the operator decides the line width of the resist pattern 104 as the defective one by mistake.

After that, each wafers in one lot are carried onto the hot plate 18 in FIG. 1, and the ultraviolet rays are irradiated onto the resist pattern 104 and cured in the atmosphere, which is subjected to the environment control, while holding the wafer temperature at 120° C.

Next, the process goes to step S13. In the step S13, the wafers in one lot are put into the etching equipment 19 in FIG. 1 one by one, and then the film 102 is etched while using the resist pattern 104 as a mask. The remaining film 102 after the etching is used as the device pattern 102a. Then, the device pattern 102a is removed.

Subsequently, the process goes to step S14. In the step S14, the wafers in one lot are put into the second line width measurement equipment 20 in FIG. 1 one by one, and the line width of the device pattern 102a in all chips in each wafer is measured therein. Similar to the uncorrected device pattern line width table shown in FIG. 7, representative points in all of the chips are employed as the device pattern 102a that is subjected to line width measurement.

Figure 12:
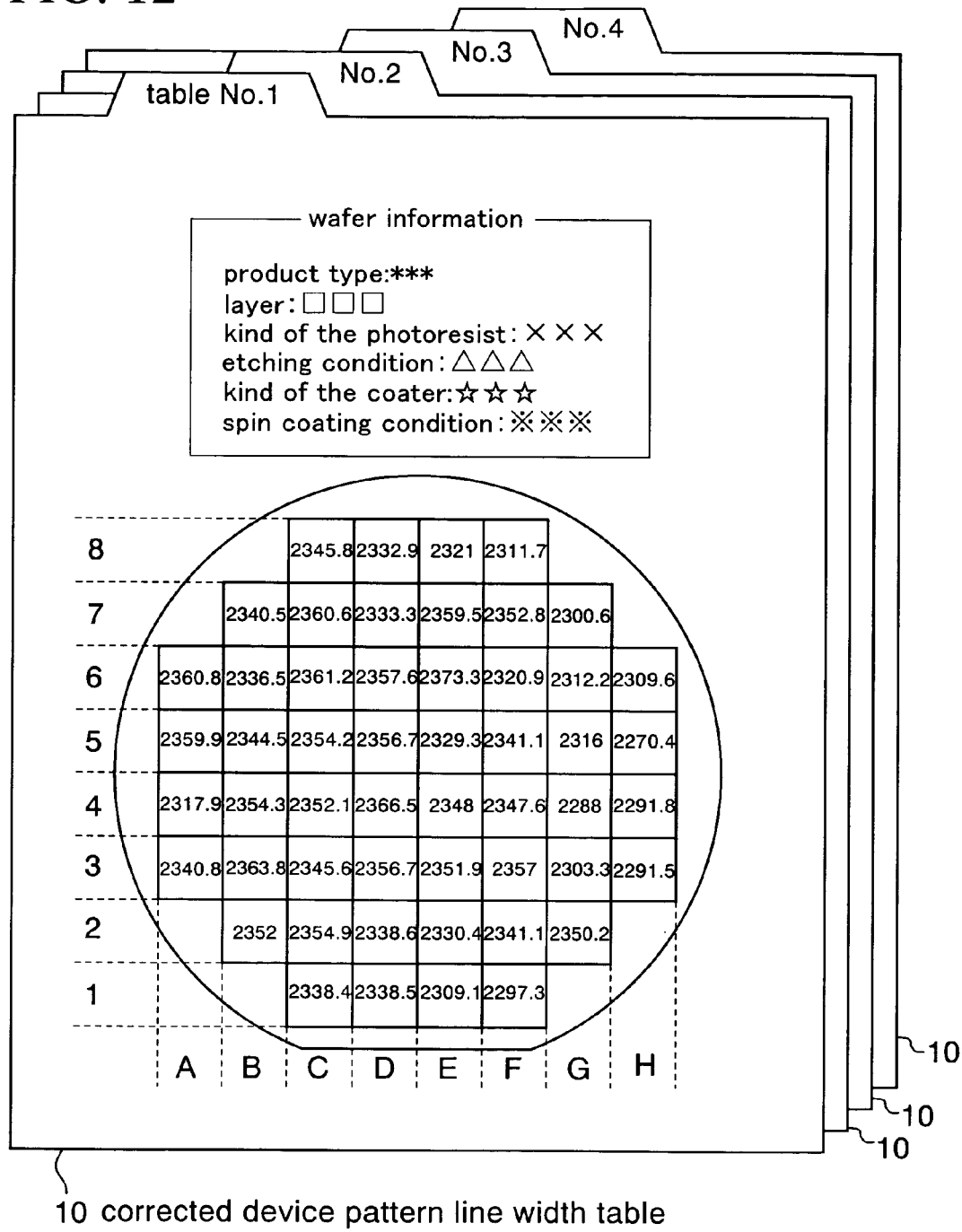
FIG. 12 is a view showing an example of a corrected device pattern line width table used in the embodiment of the present invention.

Then, the process goes to step S15. In the step S15, the line widths of the device pattern 102a in each wafers, which is measured in the step S14, are transferred to the device pattern line width database 8. According to this transmission, a table 10 shown in FIG. 12 (referred to as a "corrected device pattern line width table" hereinafter) is stored in the database 8 every wafer one by one. This corrected device pattern line width table 10 is addressed by the above described wafer information, and contain the in-plane distribution of the line width of the device pattern 102a as the data.

According to above steps, the lithography step and the etching step of one lot are completed.

After that, the process goes to step S16, and the wafers in one lot are sent out to the subsequent step, e.g., the step of forming the insulating film, or the like.

Meanwhile, if NO is decided in any one of above steps S1, S5, S6, the process goes to a routine of the normal exposure process shown in FIG. 6.

In this routine, the pilot wafer positioned at the head of one lot is exposed/developed in step S18. Then, the line width of the resist pattern 104 in the pilot wafer is measured by the line width measurement equipment.

Next, the process goes to step S19. In the step S19, a deviation of the line width value measured in step S20 from the target value of the line width of the resist pattern 104 is calculated, and then the correction of the exposure time applied to the subsequent product wafer is executed based on an amount of deviation by chip to chip. The method of correcting such exposure time has been established sufficiently in the existing exposing step.

After that, the process goes to step S20. In the step S20, the product wafers in one lot are fed to the exposing equipment 14 in FIG. 1 one by one, and then the photoresist 103 on the product wafers is exposed chip by chip by using the exposure time calculated every chip as above. After the exposure, PEB is performed for the photoresist 103 in the hot plate 15 in FIG. 1.

Next, the process goes to step S21. Then, all wafers in one lot are put into the developing equipment 16 to develop the photoresist 103, and thus the resist pattern 104 is formed on all wafers.

Subsequently, the process goes to step S22. In the step S22, the line width of the resist pattern 104 is measured in the first line width measurement equipment 17 such as CD-SEM, or the like. This measurement is performed for all product wafers in one lot, and the measurement is made at the representative point in all chips in each wafers. In order to increase a throughput, the measurement may be performed for about two to five wafers picked up from one lot, instead of measuring all wafers.

Thereafter, the product wafers in one lot are carried onto the hot plate 18 in FIG. 1, and the resist pattern 104 is cured by the ultraviolet rays while heating.

Next, the process goes to step S23. In the step S23, the product wafers in one lot are put into the etching equipment 19 in FIG. 1 one by one, and the film 102 is etched while using the resist pattern 104 as a mask. The film 102 left after the etching is made into the device pattern 102a.

Subsequently, the process goes to step S24. In the step S24, the product wafers in one lot are put into the second line width measurement equipment 20 in FIG. 1 one by one, and then the line width of the device pattern 102a in all chips in each wafers is measured therein. As the device pattern subjected to the measurement, the pattern at the representative point decided previously in common in all chips is employed.

Next, the process goes to step S25. In the step S25, the in-plane distribution of the line width of the resist pattern 104 after the development and measured in step S22 is transferred to the resist pattern line width database 5. Then, it is decided whether or not the in-plane distribution of the line width of the device pattern 102a after the etching and measured in step S23 should be transferred to the device pattern line width database 8.

In this decision, such case is decided as being transferred (YES) where the current lot is new type and similar type of lot is expected to be fed in feature.

Figure 13:
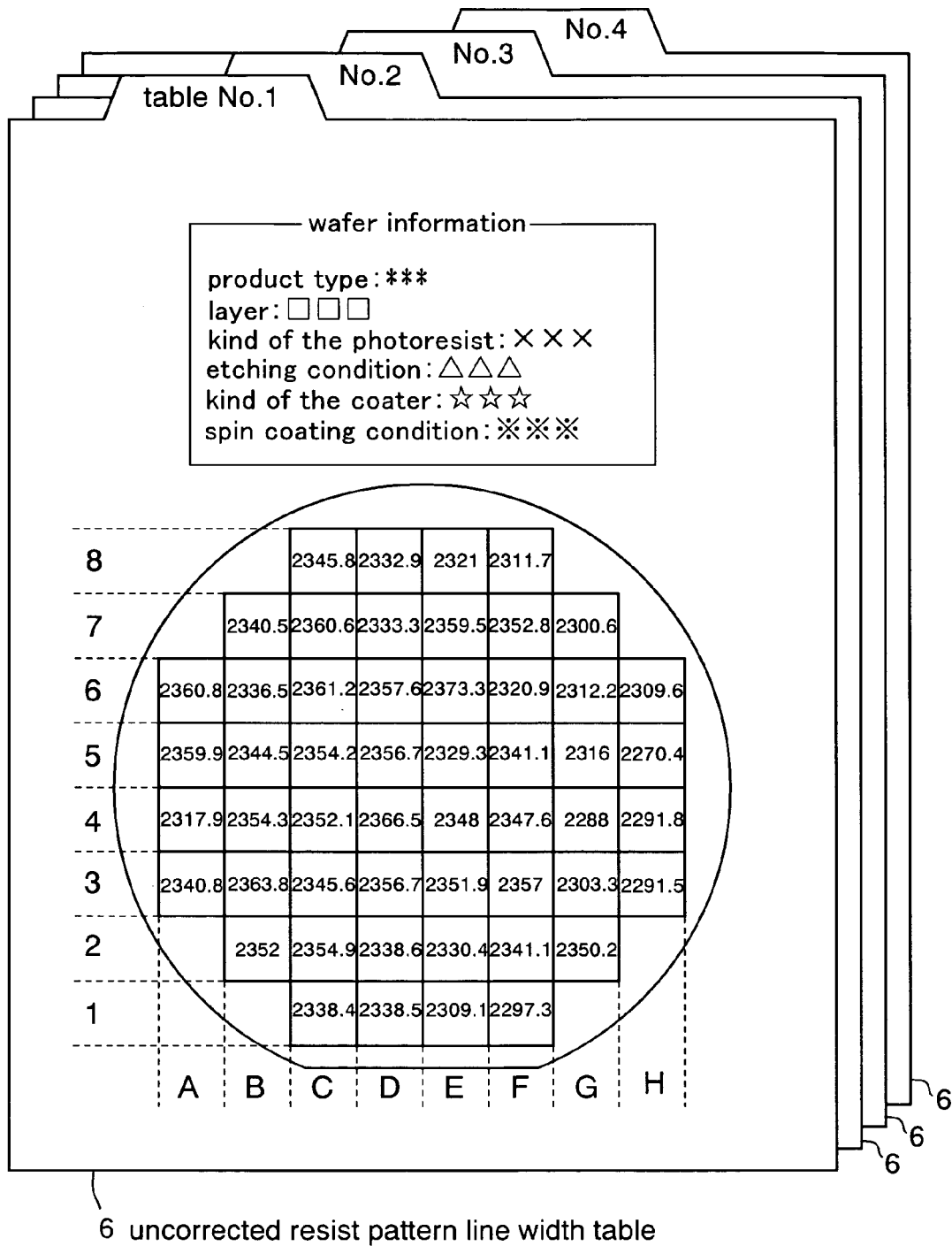
FIG. 13 is a view showing an example of an uncorrected resist pattern line width table used in the embodiment of the present invention.

In such case, the process goes to step S26. In the step S26, the in-plane distribution of the line width of the resist pattern 104 is stored in the resist pattern line width database 5 in the form of a table 6 shown in FIG. 13 (referred to as an "uncorrected resist pattern line width table" hereinafter) by wafer to wafer. In this uncorrected resist pattern line width table (first uncorrected table) 6, the above wafer information are used as the address information and the table number is designated to each tables. Moreover, each table 6 has the in-plane distribution of the line width of the resist pattern 104 measured in step S22 as the data.

Also, the in-plane distribution of the line width of the device pattern 102a is stored in the device pattern line width database 8 in the form of the uncorrected device pattern line width table (second uncorrected table) 9 shown in FIG. 7 by wafer to wafer.

By storing table 9 in the device pattern line width database 8 in this manner, the number of stored tables 9 increases. Accordingly, in the subsequent lot, if the operator decides in step S1 that the exposure correction be made (YES), it is easily decided in step S5 that the correction can be made based on the past history (YES). Therefore, such a possibility is increased that the exposure correction can be made fully automatically. As a result, the operator's burden caused by executing the exposure correction manually can be lessened and also a throughput of the exposing step can be accelerated.

After step S6 is completed in this manner, the process goes to step S16 already described above in FIG. 5. Then, the lot is sent out to the next step.

On the other hand, in the case where the subject wafer is sporadically fed into the exposure step for developing or experimental purposes, it is decided in the step S25 that the in-plane distribution of the line width should not be transferred to the uncorrected database 9 (NO). Such wafer shows the line width distribution having the tendency different from the product wafers. Therefore, if the in-plane distribution of the line width of this wafer is transferred to the databases 5, 9, the tendencies of the data stored in each databases 5, 9 are disturbed and thus their reliability is lowered. As such, it is not preferable to transfer the in-plane distribution of the line width of such wafers to the databases 5, 9, and it is preferable to decide NO in step S25.

If NO is decided in step S25 in this manner, the process goes to step S16 in FIG. 5 without performing step S26. Then, the lot is sent out to the next step.

According to the above embodiment, semiconductor wafer (uncorrected device pattern line width table 9) that has the same wafer information as the current subject wafer is extracted from wafers that are produced in the past in the step S4. Then, in step S6, it is decided whether or not the variation of the line width of the device pattern 102a in the reference chip in the semiconductor wafers extracted in step S4 falls within the tolerance over the extracted past semiconductor wafers. Thereafter, if it is decided that the variation falls within the tolerance, the exposure time of the subject semiconductor wafer is corrected by using the exposure correction table by chip to chip.

The variation of the line width of the device pattern 102a can be used as one criterion to decide whether or not the line width is distributed statistically stably in the extracted wafers in the past. Therefore, the exposure time can be corrected with good precision by executing the correction of the exposure time after the variation is decided in a manner described above, and a yield of the semiconductor device can be improved.

Also, in step S5 prior to step S6, it is decided whether or not the semiconductor wafers extracted in the past are present in number to exceed the reference number and then, if the semiconductor wafers are present in excess of the reference number, the process goes to step S6. According to this, such a problematic situation can be prevented from being occurred that the reliability of the line width distribution is statistically lowered due to the small number of the semiconductor wafers extracted in the past, and also the correction of the exposure time can be carried out with better precision.

In particular, in the case where the chemically-amplified resist is employed as the photoresist, the line width of the resist pattern 104 is varied depending on the type of the resist or the wafer temperature during the PEB. Therefore, in this case, by employing an information containing at least either the type of the resist or the wafer temperature at the PEB as the information used in the above, the error of the line width of the device pattern 102a caused due to these factors can be absorbed and thus the exposure correction can be made more precisely.

The wafer temperature during the PEB exert a great influence on the chemically-amplified resist that uses the exposure light whose wavelength is shorter than KrF. Therefore, it is particularly preferable to employ the above wafer information when such chemically-amplified resist is employed.

In contrast, in the case of the photoresist that employs the i-line as the exposure light, the line width of the resist pattern 104 varies depending on the wafer temperature applied when the resist pattern 104 is cured by the ultraviolet rays. Therefore, by employing the information containing the temperature in the curing as the above wafer information, the error of the line width of the device pattern 102a caused due to the curing can be absorbed and also the precise correction exposure time can be obtained.

Also, regardless of the resist type, when the wafer information containing the factors that affects the ultimate line width of the device pattern 102a are employed, the exposure time can be corrected to absorb the variation of the line width due to such factors. Such factors include, for example, type of the chip such as DRAM, FeRAM, EEPROM, etc., type of the coating equipment used to coat the photoresist, coating conditions of the coating equipment, etching conditions in etching the film, layers in which the device pattern is formed, and the like.

Figure 14:
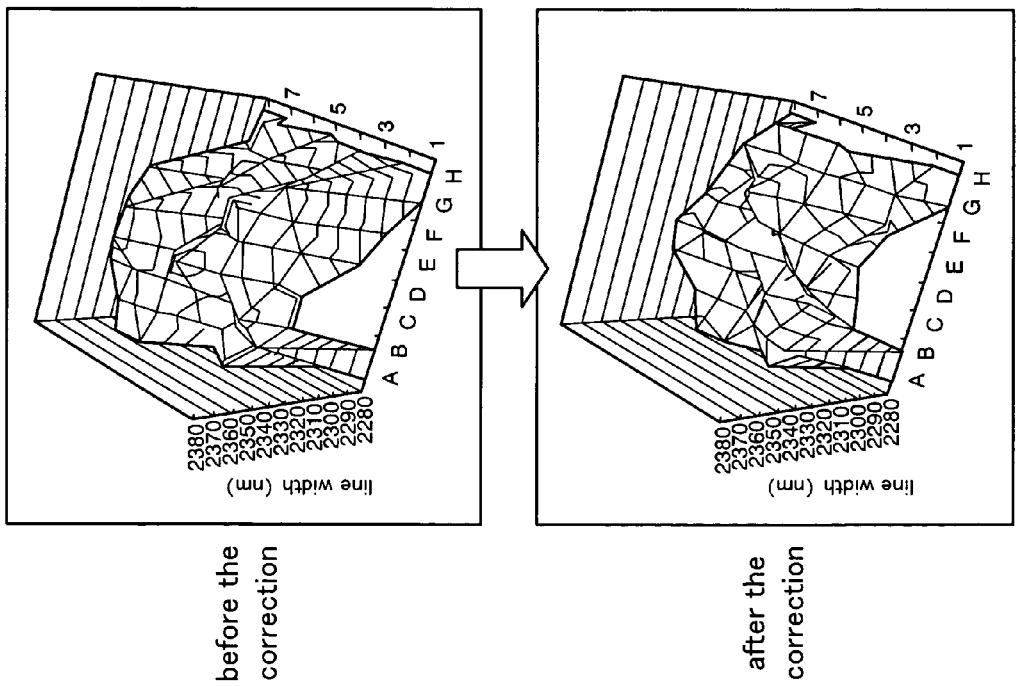
FIG. 14 is graphs showing a line width distribution of a device pattern in the wafer of the type shown in FIG. 3 before and after an exposure amount is corrected by the embodiment of the present invention respectively.

FIG. 14 is graphs showing the line width distribution of the device pattern 102a in the wafer of the type shown in FIG. 3 before and after the exposure amount is corrected by the above embodiment. As shown in this, the line width of the device pattern 102a is not uniform in the wafer plane before the correction, but the line width distribution is averaged uniformly in the wafer plane after the correction, which shows the effect of the present embodiment.

Figure 15:
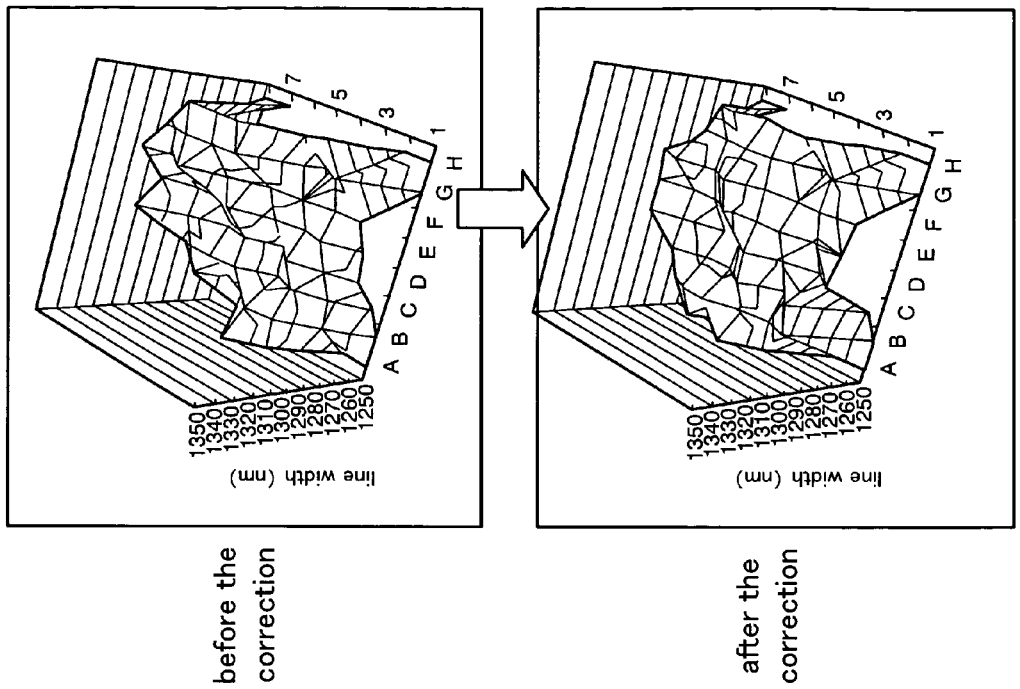
FIG. 15 is graphs showing a line width distribution of a device pattern in the wafer of the type shown in FIG. 4 before and after an exposure amount is corrected by the embodiment of the present invention respectively.

On the other hand, FIG. 15 is graphs showing the line width distribution of the device pattern in the wafer of the type shown in FIG. 4 before and after the exposure amount is corrected by the above embodiment. In this wafer type, since the line width distribution before the correction is not concentric as shown, the exposure correction cannot be made with good precision by the method in Patent Literature 2. However, the line width distribution can be averaged uniformly as shown by making the exposure correction by the method in the present embodiment.

The embodiment of the present invention is explained in detail as above. But the present invention is not limited to the above embodiment.

For example, in the above, the exposure correction table 22 in which the line width w of the device pattern 102a is related with the exposure time T is employed in step S7.

However, an exposure correction table in which the line width W of the resist pattern 104 is related with the exposure time T by a correlation W=f(T) may be employed in place of above table. This exposure correction table is addressed by the above described wafer information.

Also, the past variation of the device pattern 102a is decided by utilizing the uncorrected device pattern line width table 9 in the step S6. However, the past variation of the resist pattern 104 may be decided by utilizing the uncorrected resist pattern line width table 6 shown in FIG. 13 in place of the above table.

The invention claimed is:

1. A semiconductor device manufacturing method comprising:
   a step of forming a film on a semiconductor wafer from which multiple semiconductor chips are produced;
   a step of coating a photoresist on the film;
   a step of calculating an exposure time for the photoresist for each semiconductor chip;
   a step of exposing a device pattern on the photoresist for the calculated exposure time;
   a step of developing the exposed photoresist and making the photoresist into a resist pattern; and
   a step of etching the film and making the film into a device pattern while using the resist pattern as an etching mask;
   wherein the step of calculating the exposure time includes
   (a) a step of deciding whether or not a variation of a line width of the device pattern or the resist pattern in a reference chip in a plurality of previously manufactured semiconductor wafers, which have the same wafer information as a subject semiconductor wafer, fall within a tolerance, and
   (b) a step of correcting the exposure time for each chip by using an exposure correction table if it is decided in the step (a) that the variation falls within the tolerance.

2. A semiconductor device manufacturing method according to claim 1, further comprising:
   (c) a step of deciding whether or not the previously manufactured semiconductor wafers having the same wafer information as the subject semiconductor wafer are present in a number to exceed a reference number, before the step (a),
   whereby the step (a) is executed if it is decided in step (c) that the previously manufactured semiconductor wafers are present in excess of the reference number.

3. A semiconductor device manufacturing method according to claim 1 or claim 2, wherein, if it is decided as NO in the step (a) or the step (c), the resist pattern is formed on a test wafer, an amount of difference between a line width of the resist pattern and a target line width is calculated, and the exposure time of the subject semiconductor wafer is corrected based on an amount of the difference.

4. A semiconductor device manufacturing method according to claim 3, further comprising:
   (d) a step of measuring a line width of the resist pattern on the semiconductor wafer for each chip, where the resist pattern being formed based on the corrected exposure time; and
   (e) a step of measuring a line width of the device pattern for each chip.

5. A semiconductor device manufacturing method according to claim 4, further comprising:
   (f) a step of deciding whether or not the subject semiconductor wafer corresponds to a new type by comparing with a plurality of previously manufactured semiconductor wafers; and
   (g) a step of transferring a measured line width value of the resist pattern to a first line width database to form a first uncorrected table, which represents a wafer in-plane distribution of the line width of the resist pattern, in the first line width database and also transferring a measured line width value of the device pattern to a second line width database to form a second uncorrected table, which represents a wafer in-plane distribution of the line width of the device pattern, in the second line width database, if it is decided in the step (f) that the subject semiconductor wafer corresponds to the new type.

6. A semiconductor device manufacturing method according to claim 5, wherein the first uncorrected table and the second uncorrected table are addressed by wafer information of the semiconductor wafer.

7. A semiconductor device manufacturing method according to claim 1, wherein the step (a) is executed by extracting the first uncorrected table, which is addressed by same wafer information as the subject semiconductor wafer, from the first line width database, and then deciding whether or not a variation of the line width of the resist pattern in the reference chip in the extracted table is fall within a tolerance over the extracted first uncorrected table.

8. A semiconductor device manufacturing method according to claim 1, wherein the step (a) is executed by extracting the second uncorrected table, which is addressed by same wafer information as the subject semiconductor wafer, from the second line width database, and then deciding whether or not a variation of the line width of the device pattern in the reference chip in the extracted table is fall within a tolerance over the extracted second uncorrected table.

9. A semiconductor device manufacturing method according to claim 1, wherein the step (a) includes,
   (a1) a step of averaging the line width of the device pattern or the resist pattern located in a predetermined portion of the reference chip over a plurality of semiconductor wafers manufactured in the past, and
   (a2) a step of calculating a range, which is within ±10% of an average value of the line width calculated in the step (a1), every reference chip and then setting the range as the tolerance.

10. A semiconductor device manufacturing method according to claim 1, wherein a table in which the exposure time T is related with the line width W of the device pattern obtained when exposed for the exposure time T via a relation W=f(T) is employed as the exposure correction table in the step (b).

11. A semiconductor device manufacturing method according to claim 10, wherein the step (b) includes,
   (b1) a step of calculating an average value $W_{AV}$ of the line width for each chip by averaging the line width of the device pattern or the resist pattern in a predetermined portion of a same chip of a plurality of semiconductor wafers manufactured in the past over the plurality of semiconductor wafers,
   (b2) a step of calculating $f^1(W_{AV})-f^1(W_0)$ as a difference $\Delta T$ of the exposure correction time for each chip, where $W_0$ is a target value of the line width of the device pattern or the resist pattern, and
   (b3) a step of calculating a value obtained by subtracting the difference $\Delta T$ from $f^1(W_{AV})$ as a corrected exposure time for each chip.

12. A semiconductor device manufacturing method according to claim 1, wherein a table in which the exposure time T is related with the line width W of the resist pattern obtained when exposed for the exposure time T via a relation W=f(T) is employed as the exposure correction table in the step (b).

13. A semiconductor device manufacturing method according to claim 1, further comprising:
   (h) a step of measuring the line width of the resist pattern for each chip;
   (i) a step of transferring a measured value of the resist pattern to a first line width database, and forming a first corrected table, which represents a wafer in-plane distribution of the line width of the resist pattern, in the first line width database;
   (j) a step of measuring the line width of the device pattern for each chip; and
   (k) a step of transferring a measured line width value of the device pattern to a second line width database, and forming a second corrected table, which represents a wafer in-plane distribution of the line width of the device pattern, in the second line width database.

14. A semiconductor device manufacturing method according to claim 13, further comprising:
   (l) displaying the line width of the resist pattern measured in the step (h) and a tolerance of the line width of the resist pattern on a displaying means, after the step (h).

15. A semiconductor device manufacturing method according to any one of claims 1, 2, or 7–14, wherein a chemically-amplified resist is employed as the photoresist, and further comprising:

a step of applying a baking (PEB: Post Exposure Bake) to the photoresist after exposure after the step of exposing the photoresist and before the step of developing the photoresist; and information containing at least one of a type of the chemically-amplified resist and a wafer temperature in the baking are employed as the wafer information.

16. A semiconductor device manufacturing method according to claim 15, wherein an exposure light whose wavelength is shorter than KrF is employed in the step of exposing the photoresist.

17. A semiconductor device manufacturing method according to any one of claims 1, 2, or 7–14, wherein an I-line is employed as the exposure light in the step of exposing the photoresist, and further comprising:

a step of applying a curing to the photoresist; and information containing at least the wafer temperature in the curing are employed as the wafer information.

18. A semiconductor device manufacturing method according to any one of claims 1, 2, or 7–14, wherein information containing at least one of a type of the chip, a type of the photoresist, a type of a coating equipment used to coat the photoresist, coating conditions in the coating equipment, etching conditions in etching the film, and a layer in which the device pattern is formed are employed as the wafer information.

* * * * *

UNITED STATES PATENT AND TRADEMARK OFFICE
CERTIFICATE OF CORRECTION

PATENT NO. : 7,186,488 B2 Page 1 of 1
APPLICATION NO. : 11/070097
DATED : March 6, 2007
INVENTOR(S) : Kouichi Nagai et al.

It is certified that error appears in the above-identified patent and that said Letters Patent is hereby corrected as shown below:

On the Title page, Item (63): Related U.S. Application Data

Please insert --Continuation of application no. PCT/JP2003/005246 filed on April 23, 2003--.

Signed and Sealed this

Twelfth Day of June, 2007

JON W. DUDAS
*Director of the United States Patent and Trademark Office*